(12) United States Patent
Kanno et al.

(10) Patent No.: US 9,142,290 B2
(45) Date of Patent: Sep. 22, 2015

(54) NONVOLATILE SEMICONDUCTOR DEVICE AND METHOD FOR DRIVING SAME

(71) Applicant: Kabushiki Kaisha Toshiba, Minato-ku (JP)

(72) Inventors: Hiroshi Kanno, Mie-ken (JP); Yoichi Minemura, Mie-ken (JP); Takayuki Tsukamoto, Mie-ken (JP); Takamasa Okawa, Mie-ken (JP); Atsushi Yoshida, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 38 days.

(21) Appl. No.: 14/078,969

(22) Filed: Nov. 13, 2013

(65) Prior Publication Data

US 2014/0293675 A1  Oct. 2, 2014

Related U.S. Application Data

(60) Provisional application No. 61/806,709, filed on Mar. 29, 2013.

(51) Int. Cl.
*G11C 11/00* (2006.01)
*G11C 13/00* (2006.01)

(52) U.S. Cl.
CPC ........ *G11C 13/0035* (2013.01); *G11C 13/0069* (2013.01); *G11C 13/0064* (2013.01)

(58) Field of Classification Search
CPC ............... G11C 2213/71; G11C 13/00; G11C 13/0002; G11C 13/0064; G11C 13/0026; G11C 13/0028

USPC ............... 365/148, 163, 158, 185.18, 189.05, 365/236, 100, 185.14
See application file for complete search history.

(56) References Cited

U.S. PATENT DOCUMENTS

| | | | |
|---|---|---|---|
| 8,300,444 B2 | 10/2012 | Nagashima et al. | |
| 2010/0277968 A1 * | 11/2010 | Tokiwa | ......................... 365/148 |
| 2011/0063887 A1 | 3/2011 | Kanda | |
| 2011/0222331 A1 | 9/2011 | Kurosawa et al. | |

* cited by examiner

*Primary Examiner* — Thong Q Le
(74) *Attorney, Agent, or Firm* — Oblon, McClelland, Maier & Neustadt, L.L.P.

(57) ABSTRACT

According to one embodiment, a nonvolatile memory device includes: a memory cell array including first wirings, second wirings, and a memory cell connected between the first wirings and the second wirings; and a control circuit unit configured to select a selected memory cell from the memory cells, perform a first operation of changing a resistance state of the selected memory cell between a first resistance state and a second resistance state, and determine whether the first operation has been properly performed or not and perform retry operation such as applying a retry pulse when the first operation has not been properly performed. The control circuit unit regards the selected memory cell as excessive retry operation and inhibits the selected memory cell in accordance with the number of times of the excessive retry operation when the number of times of the retry operation is over k times.

14 Claims, 11 Drawing Sheets

$m$: The number of times of cumulative rewriting at the present time (e.g. 10)

$m'$: The number of times of cumulative rewriting when excessive retrying occurs

| Word line | Bit line | The number of times of cumulative rewriting when excessive retrying occurs ($m'$) |
|---|---|---|
| X1 | Y1 | 5 |
| X1 | Y2 | 5 |
| X1 | Y1 | 6 |
| X1 | Y1 | 7 |
| X2 | Y3 | 7 |
| X1 | Y1 | 8 |
| X1 | Y2 | 8 |
| X1 | Y1 | 10 |

The control circuit detects and counts the number of times of rewriting of the bit of the same address The incidence of excessive retrying = 5/10 = 50% → Compare this to the second standard value

*m*: The number of times of cumulative rewriting at the present time (e.g. 100)

*m'*: The number of times of cumulative rewriting when excessive retrying occurs

*P*: The number of times back to the past (e.g. 10)

Remove data on and before the *P*-th time (the tenth time) back to the past from now as needed The control circuit detects and counts the number of times of rewriting of the bit of the same address The incidence of excessive retrying = 4/10 = 40% ⇒ Compare this to the second standard value

| Word line | Bit line | The number of times of cumulative rewriting when excessive retrying occurs (*m'*) |
|---|---|---|
| ~~X1~~ | ~~Y1~~ | ~~85~~ |
| ~~X1~~ | ~~Y2~~ | ~~89~~ |
| X1 | Y1 | 95 |
| X1 | Y1 | 96 |
| X2 | Y3 | 97 |
| X1 | Y1 | 99 |
| X1 | Y2 | 99 |
| X1 | Y1 | 100 |

FIG. 7 m: The number of times of cumulative rewriting at the present time (e.g. 100)

m': The number of times of cumulative rewriting when excessive retrying occurs

| Word line | Bit line | The number of times of cumulative rewriting when excessive retrying occurs (m') |
|---|---|---|
| X1 | Y1 | 85 |
| X1 | Y2 | 89 |
| X1 | Y1 | 95 |
| X1 | Y1 | 96 |
| X2 | Y3 | 97 |
| X1 | Y1 | 99 |
| X1 | Y2 | 99 |
| X1 | Y1 | 100 |

The number of times of cumulative rewriting when (X1, Y1) has experienced excessive retry operation for the first time (u)

The incidence of excessive retrying = 5/15 = 33% ⇒ Compare this to the second standard value

NONVOLATILE SEMICONDUCTOR DEVICE AND METHOD FOR DRIVING SAME

CROSS-REFERENCE TO RELATED APPLICATIONS

This application is based upon and claims the benefit of priority from U.S. Provisional Patent Application 61/806,709, filed on Mar. 29, 2013; the entire contents of which are incorporated herein by reference.

FIELD

Embodiments described herein relate generally to a nonvolatile semiconductor device and method for driving same.

BACKGROUND

A memory cell incorporated in a nonvolatile memory device typified by a resistance change memory is an element capable of electrically switching at least two resistance values (for example, a high resistance state and a low resistance state). The memory cell (bit) is located at the intersection of an upper wiring (bit line) and a lower wiring (word line). Memory cells are arranged two-dimensionally to form a memory cell array. A memory cell array of a multiple-layer structure is formed by stacking memory cell arrays.

When performing an operation in which a selected bit, which is a selected memory cell, is rewritten from the low resistance state to the high resistance state (reset operation) or an operation in which the bit is rewritten from the high resistance state to the low resistance state (set operation), a voltage is applied between the bit line and the word line connected to the selected memory cell. That is, voltage pulse is applied to the selected memory cell in the set/reset operation. Normally the resistance value is switched by one pulse application.

However, when the cycle of changing the resistance value is repeated many times, there may be a case where the resistance value does not change even when a voltage pulse is applied multiple times. This selected bit is referred to as a faulty bit in the following. It is a waste of time to apply a voltage pulse to the faulty bit multiple times to attempt the set/reset operation, and this may lead to a performance reduction of the resistance change memory.

BRIEF DESCRIPTION OF THE DRAWINGS

FIG. 3 is an example of a diagram showing the tendency with which one of the plurality of memory cells becomes a faulty bit;

FIG. 6 is an example of a diagram showing examples of the incidence of retrying according to the first embodiment;

FIG. 7 is an example of a diagram showing examples of the incidence of retrying according to a second embodiment;

FIG. 8 is an example of a diagram showing examples of the incidence of retrying according to a third embodiment;

DETAILED DESCRIPTION

According to one embodiment, a nonvolatile memory device includes: a memory cell array including first wirings each extending in a first direction, second wirings each extending in a second direction crossing the first direction, and a memory cell connected between the first wirings and the second wirings; and a control circuit unit configured to select a selected memory cell from the memory cells, perform a first operation of changing a resistance state of the selected memory cell between a first resistance state and a second resistance state different from the first state, and determine whether the first operation has been properly performed or not and perform retry operation such as applying a retry pulse when the first operation has not been properly performed. The control circuit unit is configured to regard the selected memory cell as excessive retry operation and inhibit the selected memory cell in accordance with the number of times of the excessive retry operation when the number of times of the retry operation is over k times (k being an integer of 1 or more).

First Embodiment

An overview of a resistance change memory according to a first embodiment will now be described using FIG. 1, FIG. 2A, and FIG. 2B.

Figure 1:
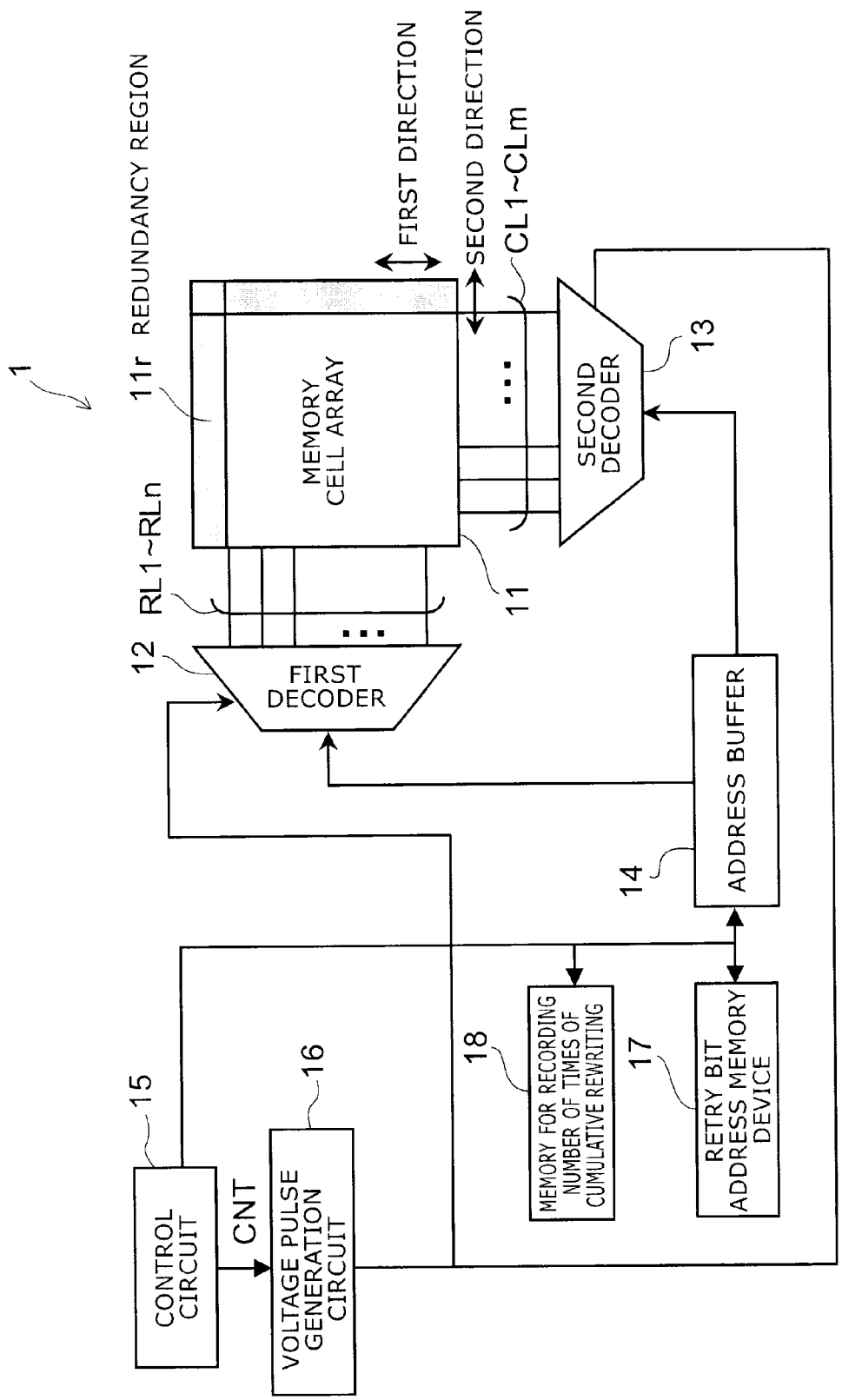
FIG. 1 is an example of a block diagram showing a resistance change memory according to a first embodiment.

FIG. 1 is an example of a block diagram showing a resistance change memory according to the first embodiment.

A resistance change memory 1 (a nonvolatile memory device 1) includes a cross-point memory cell array 11. First, the structure of the memory cell array 11 is described. There is a redundancy region 11r inside or outside the memory cell array 11.

Figure 2A:
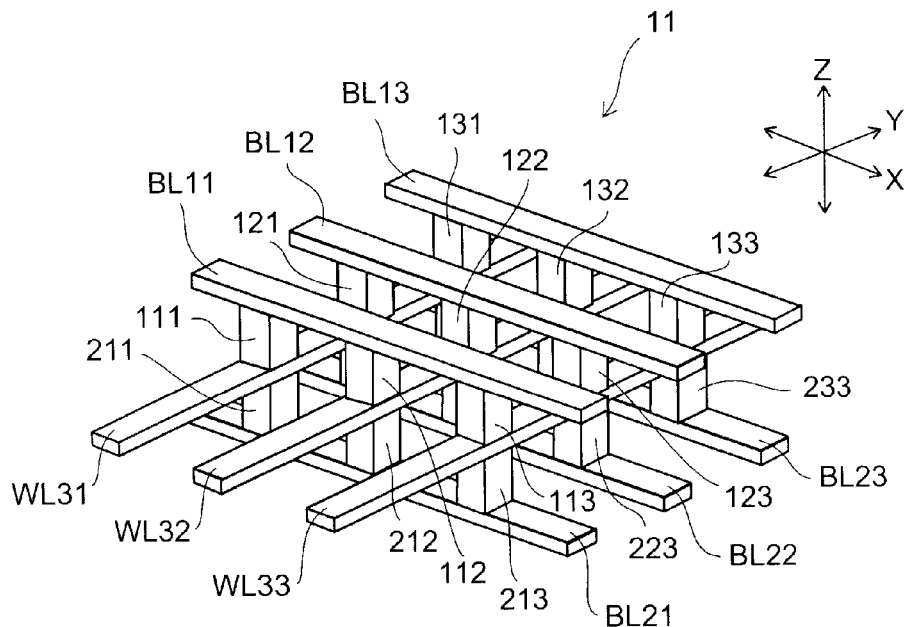
FIG. 2A is an example of a schematic perspective view of part of the memory cell array according to the first embodiment.
Figure 2B:
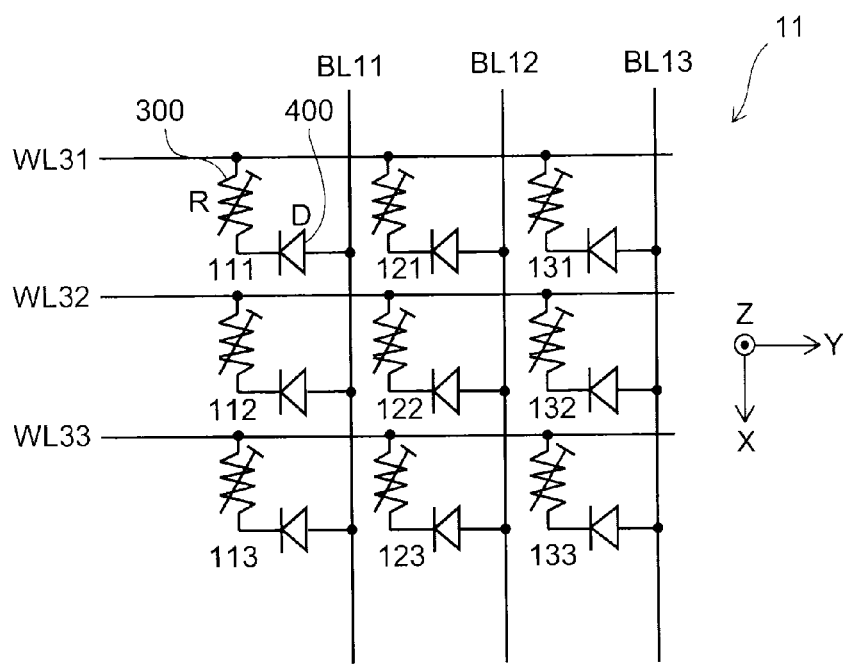
FIG. 2B is an example of an equivalent circuit diagram of the memory cell array according to the first embodiment.

FIG. 2A is an example of a schematic perspective view of part of the memory cell array according to the first embodiment, and FIG. 2B is an example of an equivalent circuit diagram of the memory cell array according to the first embodiment.

FIG. 2A shows two layers of memory cell arrays as an example. A memory cell is provided at the intersection of each bit line and each word line. Memory cells are arranged in a matrix configuration in the X direction (a first direction) and the Y direction (a second direction). The bit line corresponds to a row line shown in FIG. 1, and the word line corresponds to a column line.

That is, memory cells 111 to 133 are provided at the intersections of bit lines 11 to 13 and word lines 31 to 33. Memory cells 211 to 233 are provided at the intersections of bit lines 21 to 23 and the word lines 31 to 33. The word lines 31 to 33 are shared by the over- and underlying memory cells.

Each bit line and each word line contain a material containing a metal, having high heat resistance, and having a low resistance value. Each bit line and each word line contain tungsten (W), titanium (Ti), tantalum (Ta), and a nitride of these, a stacked structure of these, or the line, for example. Each bit line and each word line are specifically formed of a line with a line width of 20 nm and a space of 20 nm with a pitch of 40 nm.

As shown in FIG. 2B, each memory cell has a memory layer (variable resistance element) 300 and a diode 400 connected in series to the memory layer 300. The memory layer 300 is an electrically rewritable memory element. The memory layer 300 stores data in a nonvolatile manner on the basis of the resistance value. The diode 400 can suppress a sneak current generated during electrical access to a selected memory cell (forming/writing/erasing/reading). One end of the memory layer 300 is connected to the word line, and the other end of the memory layer 300 is connected to one end of the diode 400. The other end of the diode 400 is connected to the bit line. The memory cells of the upper layer and the lower layer may be separated with the word line at the border, and the direction of the diode 400 may be different between the memory cells of the upper layer and the memory cells of the lower layer.

Thus, the resistance change memory 1 includes a plurality of bit lines each extending in the first direction, a plurality of word lines each extending in the second direction crossing the first direction, and a memory cell connected between each of the plurality of bit lines and each of the plurality of word lines. The resistance change memory 1 includes a control circuit 15 connected to each of the plurality of bit lines and each of the plurality of word lines and a memory unit connected to each of the plurality of bit lines, each of the plurality of word lines, and the control circuit 15.

The description is continued with reference to FIG. 1 again. A first decoder 12 is disposed on the lateral side in the second direction of the memory cell array 11. A second decoder 13 is disposed on the lateral side in the first direction of the memory cell array 11. The first direction crosses the second direction. A plurality of row lines (rows) RL1 to RLn (n being a natural number of 2 or more) extend from the first decoder 12 in the second direction. A plurality of column lines (columns) CL1 to CLm (m being a natural number of 2 or more) extend from the second decoder 13 in the first direction.

A plurality of memory cells are arranged in the memory cell array 11. The address of each of the plurality of memory cells is selected by an address signal inputted to an address buffer 14 in the time of reading/setting (writing)/resetting (erasing). Part of the address signals are inputted to the first decoder 12 from the address buffer 14, and part of the address signals are inputted to the second decoder 13 from the address buffer 14.

The first decoder 12 selects one of the plurality of row lines RL1 to RLn on the basis of the address signal. The second decoder 13 selects one of the plurality of column lines CL1 to CLm on the basis of the address signal. Consequently, the memory cell disposed between the selected row line and the selected column line is selected. Hereinafter, the row line selected may be referred to as a "selected row line," the column line selected may be referred to as a "selected column line," and the memory cell selected may be referred to as a "selected cell."

In the time of setting or resetting, the control circuit 15 specifies the magnitude (voltage value) and the width (duration) of the pulse that a voltage pulse generation circuit 16 should output, and outputs them as a control signal CNT to the voltage pulse generation circuit.

On receiving the control signal CNT, the voltage pulse generation circuit 16 generates a set voltage/a reset voltage having a prescribed magnitude (voltage value) and a prescribed width (duration).

The set voltage/reset voltage outputted from the voltage pulse generation circuit 16 (hereinafter, occasionally referred to as a voltage pulse) is supplied to the selected row line via the first decoder 12. The voltage pulse outputted by the voltage pulse generation circuit 16 is supplied to the selected column line via the second decoder 13. A non-selection voltage is supplied to the column lines other than the selected row line and the selected column line (not-selected row lines/column lines) from the voltage pulse generation circuit 16 via the first decoder 12 and the second decoder 13. Consequently, the resistance value of the selected memory cell changes, and the resistance value of the memory cells other than the selected memory cell (not-selected memory cells) does not change.

After that, reading for verifying whether the resistance value of the selected cell reaches within the specifications or not (verify read operation) is performed. Normally the magnitude, the time span, etc. of the voltage pulse are decided so that the expected change of the resistance value occurs by one voltage pulse application.

However, there is a memory cell in which the expected resistance change does not occur by one voltage pulse application. A voltage pulse is applied to such a memory cell again. At this time, the magnitude and/or the time span of the applied voltage may be changed.

After the voltage pulse of the second time is applied, verify read operation is performed again. Here, when the expected resistance change has not yet occurred, a third and a fourth voltage pulse application are performed. In most cases, the expected resistance change occurs by several times of voltage pulse application. The voltage pulse of the second or subsequent time may be referred to as a retry pulse voltage. A series of operations from the application of a retry pulse to the verify read operation after the application of the retry pulse voltage may be referred to as a "retry operation."

When the cycle of resistance change is repeated many times, a memory cell less likely changing the resistance value may be appeared. Due to the dimensional variation of the memory cell, there is a memory cell less likely changing the resistance value from the initial state. The control circuit 15 concludes that a memory cell in which the expected resistance change does not occur even when a retry pulse voltage is applied specification times is a faulty bit. After that, in order to ensure a certain number of memory cells that operate normally (memory capacity), the control circuit 15 performs to replace the faulty bit with a normal memory cell in the redundancy region.

Next, it is shown the tendency with which memory cells become faulty bits, the incidence of a retry operation, and the relationship between the incidence of a retry operation and the probability of occurrence of a faulty bit.

Figure 3:
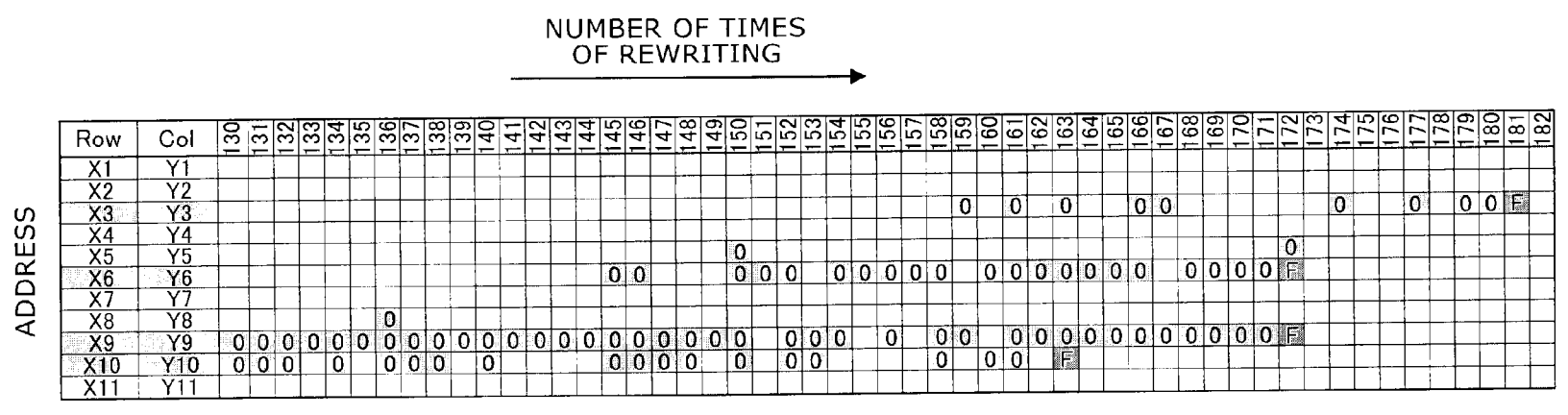

FIG. 3 is an example of a diagram showing the tendency with which one of the memory cells becomes a faulty bit.

The horizontal direction of FIG. 3 shows the number of times of rewriting, and the vertical direction shows the address of each of the memory cells. Here, the number of times of rewriting means the number of times by which one set operation and one reset operation are performed.

Of the memory cells, which a retry pulse voltage has been applied four or more times for rewriting from the low resistance state to the high resistance state (reset operation), are expressed by "0", for example. The address determined as a faulty bit in which rewriting cannot be made even when a retry pulse voltage has been applied the prescribed maximum times is expressed as "F".

The results of FIG. 3 show that a memory cell, in which the number of times of retry operation is large (hereinafter, occasionally referred to as "excessive retry operation"), has a high tendency to become a faulty bit thereafter. For example, it is the memory cell of the address painted in color in FIG. 3.

Here, a retry bit memory device 17 can store the address of a memory cell (bit) that has been performed excessive retry operation and the number of times of cumulative rewriting in which excessive retry operation is performed (the number of times of excessive rewriting). Also the number of times by which a retry pulse voltage is applied (the number of retry counts) etc. can be stored in the retry bit memory device 17. A memory for recording the number of times of cumulative rewriting 18 can store the number of times of cumulative rewriting of the memory cell (the number of times of cumulative rewriting). The retry bit memory device 17 and the memory for recording the number of times of cumulative rewriting 18 may be integrated as one memory unit. The retry bit memory device 17 or the memory can also store the number of times of cumulative rewriting etc. in units of memory cells that store data by one set operation or one reset operation or in units of memory cells that store data by one reset operation, not in units of one memory cell.

The control circuit 15 can calculate the incidence of a retry of a memory cell in question from the number of times of excessive rewriting recorded in the retry bit memory device 17 and the number of times of cumulative rewriting recorded in the memory for recording the number of times of cumulative rewriting 18. Further, when the incidence of a retry is over a target value, the control circuit 15 can perform the processing of replacing the memory cell in question with a memory cell in the redundancy region.

As a result, a sign of a memory cell that is estimated to become a faulty bit is detected in an early stage. Thus, a memory cell that may become a faulty bit can be inhibit from being used in an early stage. Consequently, the waste of time in which a retry pulse voltage is applied many times to a memory cell less likely changing the resistance can be avoided, and the performance of the resistance change memory can be improved.

A method for driving a resistance change memory according to the first embodiment will now be described.

In the first embodiment, the incidence of excessive retry operation is introduced. The incidence of excessive retrying is the rate of the number of times of occurrence of excessive retry operation and the number of times of cumulative rewriting from the rewriting of the first time to a certain point of time. In other words, the incidence of excessive retrying is a value expressed as percentage of a value obtained by a process in which the number of times by which the number of retry counts is not less than a prescribed value (for example, four times or more) in the number of times of cumulative rewriting (the number of times of excessive rewriting) is divided by the number of times of cumulative rewriting.

Figure 4:
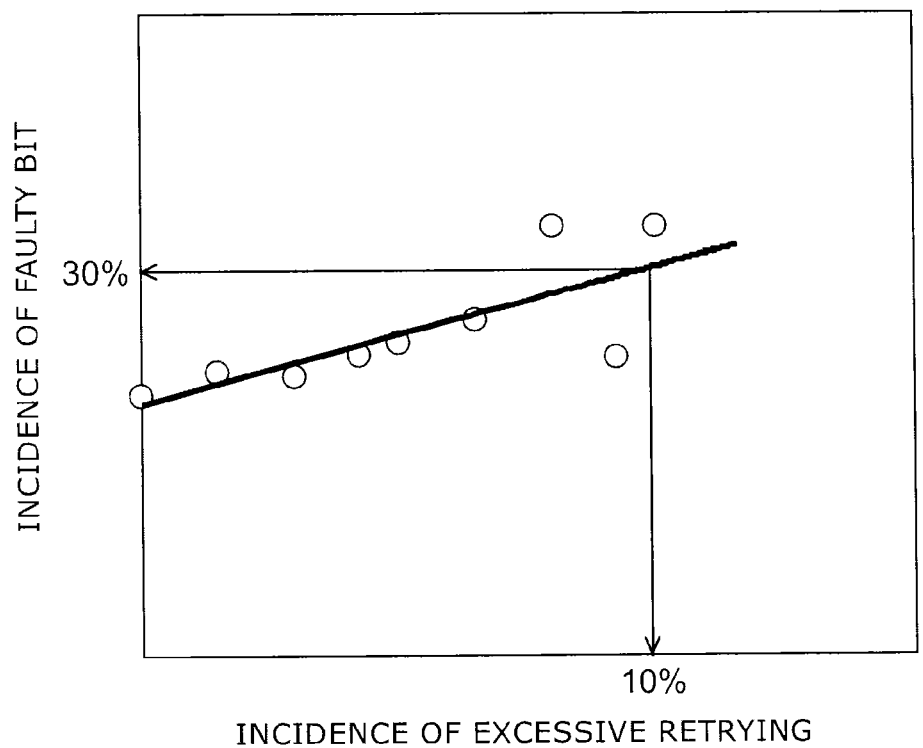
FIG. 4 is an example of a diagram showing the relationship between the incidence of excessive retrying and the probability of occurrence of a faulty bit.

FIG. 4 is a diagram showing the relationship between the incidence of excessive retrying and the probability of occurrence of a faulty bit. The vertical axis is in a linear scale, and the horizontal axis is in a logarithmic scale.

Here, FIG. 4 shows that there is a correlation between the incidence of excessive retrying and the probability of occurrence of an unnecessary bit. It is found that when the incidence of excessive retrying of a certain memory cell is 10%, the probability with which the memory cell will become a faulty bit in the future is approximately 30%, for example. In the first embodiment, when the incidence of excessive retrying has reached a target value, the memory cell will become a faulty bit in the future, and the faulty bit inhibited at this time. By replacing the memory cell estimated to become a faulty bit with a bit in the redundancy region in an early stage, it is possible to prevent a reduction of the resistance change memory 1, for example.

Figure 5:
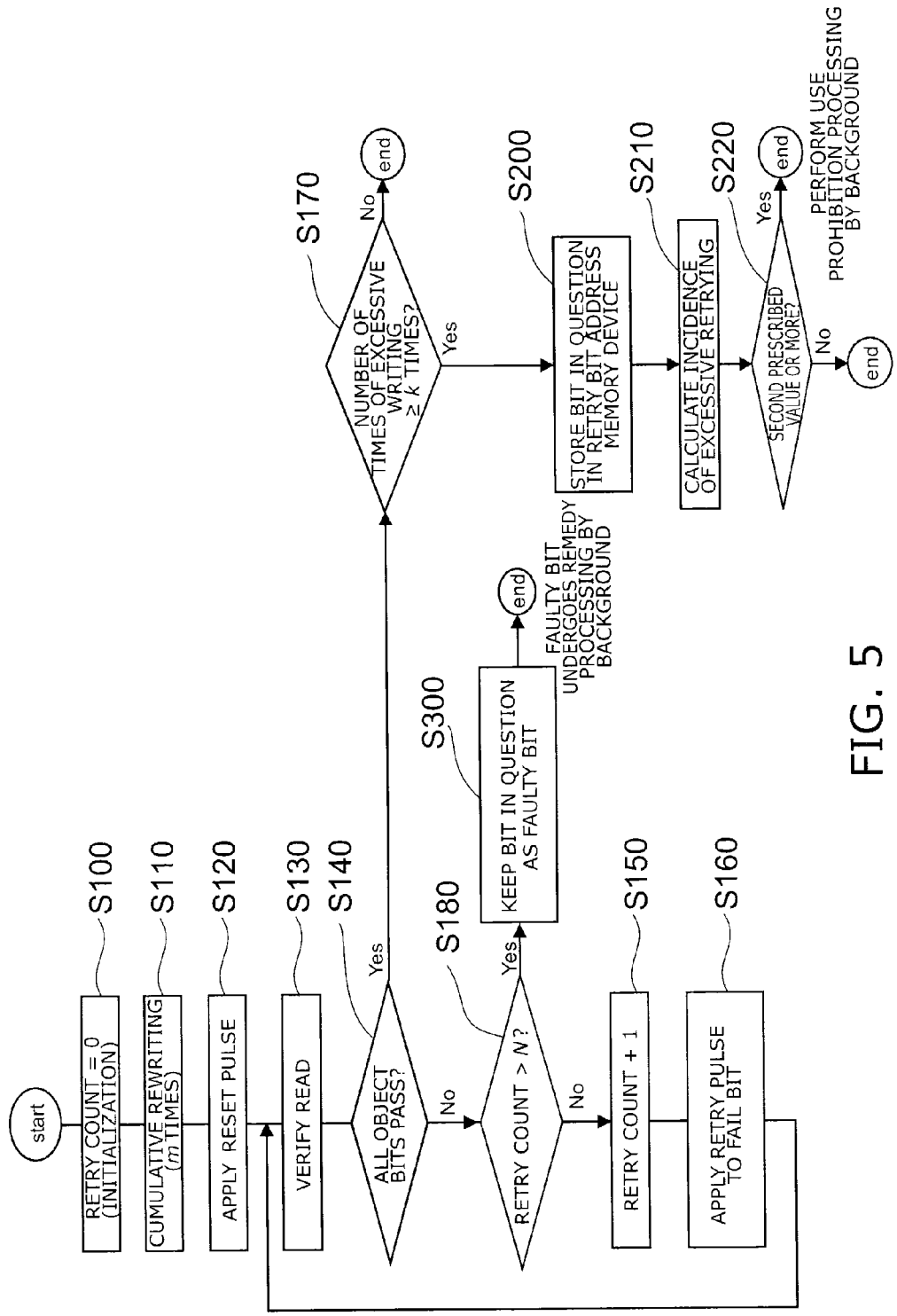
FIG. 5 is an example of a diagram showing a flowchart of a method for driving a resistance change memory according to the first embodiment.

FIG. 5 is an example of a diagram showing a flowchart of a method for driving a resistance change memory according to the first embodiment (set operation/reset operation).

In the flowchart described below, the control circuit 15 configures to control the connection and disconnection between wirings by a switching changeover, the selection of a wiring, the control of the supply of a prescribed potential to each wiring, the detection of the state of a memory cell, and the replacement of an wiring using the first decoder 12 and the second decoder 13 described above.

The control circuit 15 can make the assessment of information, calculation, etc. For example, the control circuit 15 calculates the incidence of a retry and determines whether the incidence of a retry is larger than a prescribed value or not. Information is stored in the retry bit memory device 17 and the memory for storing the number of times of cumulative rewriting 18.

The writing and reading of data in the retry bit memory device 17 and the memory for recording the number of times of cumulative rewriting 18 are controlled by the control circuit 15.

First, the control circuit 15 sets the number of retry counts to the initial value "0" beforehand (step S100).

Next, the control circuit 15 reads the number of times of cumulative rewriting corresponding to the address of a memory cell in the write operation, from the memory for storing the number of times of cumulative rewriting 18 (step S110).

Next, a reset voltage or a set voltage is applied to the selected memory cell in accordance with data to be written (step S120). The reset voltage is a reset pulse voltage, for example, and the set voltage is a set pulse voltage, for example.

Next, it is detected whether the resistance of the of memory cells to which a reset voltage has been applied has changed from a low resistance value to a high resistance value or not or whether the resistance of the memory cells to which a set voltage has been applied has changed from a high resistance value to a low resistance value or not (step S130).

Next, the control circuit 15 determines whether the memory cells to which a reset voltage or a set voltage has been applied have changed to a target resistance value or not (step S140). The steps S130 and S140 may be collectively referred to as verify read operation.

When the resistance of all (or a target number or less, with consideration of ECC) of the memory cells to which a reset voltage or a set voltage has been applied has changed to the target resistance value, no retry is performed, and the flowchart proceeds to step S170 (Yes of S140).

When the resistance of none of the memory cells has changed to the target resistance value or the resistance of a certain number or less of the memory cells has not changed to the target resistance value, the flowchart proceeds to step S180 (No of S140).

In step S180, the control circuit 15 determines whether the number of retry counts is over a value N (for example, a value in a range of 5 to 20 times) or not (step S180). Here, a memory cell in which the number of retry counts is over the value N is regarded as a memory cell of which the resistance will not change from a low resistance value to a high resistance value even if a retry is further performed, and is categorized as an inhibit memory cell (step S300). The inhibit memory cell is not used thereafter (end).

On the other hand, in the case of not exceeding the prescribed value N, S150, S160, S130, and S140 of a retry operation are performed in this order (No of S180).

For example, the control circuit 15 applies a reset voltage or a set voltage (retry pulse voltage) again in accordance with data to be written. Here, when the control circuit 15 applies a retry pulse voltage once, the control circuit 15 adds one to the number of retry counts (step S150). After that, the control circuit applies a retry pulse (step S160).

The order of step S150 and step S160 is arbitrary. Step S150 and step S160 may be performed simultaneously, or either of step S150 and step S160 may be performed earlier.

Next, it is determined whether the resistance of the memory cell to which a retry voltage has been applied again has changed to a target value or not (step S140). That is, verify read operation is performed. When the resistance of the memory cell has not changed to the target resistance value by the retry operation, the step S140 to step S160 is repeated; a reset voltage is applied to the memory cell prescribed times, and the number of retry counts undergoes addition for each retry operation.

When the resistance of the memory cell has changed to the target value by the retry operation, the retry operation ends (Yes of step S140). After that, the control circuit 15 determines whether the retry count is k times or more (k being an integer of 1 or more) or not (step S170). Here, when the retry count is smaller than k times, the write operation is ended (No of S170).

On the other hand, when the retry count is k times or more, the flowchart proceeds to step S200 (Yes of S170). After that, the control circuit 15 stores in the retry bit memory device 17 the address of the memory cell that has been performed excessive retry operation. In addition, the control circuit 15 stores in the retry bit memory device 17 the number of times of rewriting in which excessive retry operation is performed, while relating this number of times to the address of the memory cell (step S200). The control circuit 15 may add one to the number of times by which excessive retry operation has been performed on the memory cell (the number of times of excessive rewriting), and may store the resulting number in the retry bit memory device 17. In addition, the control circuit 15 stores the number of times of cumulative rewriting performed on the memory cell in the memory for recording the number of times of cumulative rewriting 18. The number of times of cumulative rewriting may be calculated in units of a page, in units of an area, or in units of a block.

Next, the control circuit 15 calculates the incidence of a retry using the number of times of cumulative rewriting m and the number of times of excessive rewriting (step S210). The incidence of a retry is a rate expressing the degree of the number of times of excessive rewriting in the number of times of cumulative rewriting m. A detailed definition of the incidence of a retry is described above.

When the incidence of excessive retrying is over a second value (for example, 30%), the control circuit 15 categorizes the memory cell of the address mentioned above as the inhibit memory cell (Yes of step S220 to end). The control circuit may inhibit the memory cell by the background operation. When the incidence of excessive retrying is not more than the second value, the set operation/reset operation is ended (No of step S220).

FIG. 6 is an example of the number of times of excessive rewriting recorded in the retry bit memory device 17, and shows an example of the incidence of a retry according to the first embodiment. Here, the number of times of cumulative rewriting when excessive retrying occurs m', the address of the word line, and the address of the bit line are stored in the retry bit memory device 17.

The incidence of excessive retrying is a value expressed as percentage of a value obtained by a process in which the number T of times by which the number of retry counts s is not less than a first value (for example, k=4 times or more) in the number of times of cumulative rewriting m (the number of times of excessive rewriting) is divided by the number of times of cumulative rewriting m.

Certain word lines are denoted by X1, X2, . . . , and bit lines are denoted by Y1, Y2, . . . , for example. In the example of FIG. 6, the number of times of cumulative rewriting m is 10 times, and the number T of times of excessive rewriting in which the number of retry counts s of the memory cell connected to the word line X1 and the bit line Y1 is not less than the first value is 5 times. At this time, the incidence of a retry is 50%. When the control circuit has determined that the 50% exceeds the second value, the memory cell provided between the word line number X1 and the bit line number Y1 is categorized as a memory cell prohibited from use.

Thus, in the resistance change memory 1, a faulty bit may be produced that does not change between the low resistance state and the high resistance state even when a voltage pulse (retry pulse voltage) is applied to the same memory cell multiple times. In such a case, in the first embodiment, a faulty bit is detected in an early stage, and the faulty bit is categorized as a memory cell inhibit. Thereby, wasted set operation and reset operation are not performed on the faulty bit. Consequently, it is possible to prevent reduction of the resistance change memory.

Although the control circuit makes a memory cell inhibition accordance with the incidence of excessive retrying (the second value), a memory cell may be inhibit in accordance with the number of times of excessive retrying. That is, step S210 may be omitted.

Second Embodiment

The incidence of excessive retrying is not limited to the rate defined in the first embodiment but may be a rate set by another definition.

FIG. 7 is an example of the number of times of excessive rewriting recorded in the retry bit memory device 17, and shows an example of the incidence of excessive retrying according to a second embodiment. Here, the number of times of cumulative rewriting when excessive retrying occurs m', the address of the word line, and the address of the bit line are stored in the retry bit memory device 17.

The incidence of excessive retrying according to the second embodiment is a value expressed as percentage of a value obtained by a process in which the number T of times by which the number of retry counts s is not less than the first value in the P times of set operations/reset operations back to the past from the present set operation/reset operation (the number of times of excessive retrying) is divided by P.

The number of times P is set to 10 times, certain word lines are denoted by X1, X2, . . . , and bit lines are denoted by Y1, Y2, . . . , for example. At this time, the control circuit erases the address (word line, bit line) of a memory cell that had experienced excessive retry operation before the past ten times. Here, FIG. 7 is an example of the incidence of excessive retrying stored in the retry bit memory device 17 when the number of times of cumulative rewriting is 100 times. Here, the control circuit 15 erases the address of a memory cell in which the number of times of cumulative rewriting when excessive retrying occurs m' is 90 or less. In the example of FIG. 7, the top two addresses are erased. Thus, the incidence of excessive retrying of the memory cell of the word line address X1 and the bit line address Y1 is 40%. Here, the control circuit 15 determines whether the 40% is larger or smaller than the second prescribed value.

By introducing such an incidence of excessive retrying, the incidence of excessive retrying in the latest P times of set operations/reset operations, in which rewriting is performed P times, back to the past from the present set operation/reset operation can be obtained. In other words, by the second embodiment, is is possible to understand an incidence of excessive retrying nearer to the state of being used. When the incidence of excessive retrying is over the second value, the memory cell provided between the word line number XX and the bit line number YY is categorized as a memory cell inhibited.

Third Embodiment

The incidence of excessive retrying may be a rate set by still another definition.

FIG. 8 is an example of a diagram showing an example of the incidence of excessive retrying according to a third embodiment.

"A second difference of the number of times Y" is introduced in the incidence of excessive retrying according to the third embodiment.

The second difference of the number of times Y is the number of times obtained by subtracting the number of times when excessive retry operation is performed for the first time u from the number of times of cumulative rewriting m.

The incidence of a retry is a value expressed as percentage of a value obtained by a process in which the number T of times by which the number of times of excessive rewriting s is not less than the first prescribed value in the second difference of the number of times (m−u) is divided by the second difference of the number of times Y(Y=m−u).

The number of times of cumulative rewriting m is 100 times, and the number of times of cumulative rewriting when the memory cell of the word line address X1 and the bit line address Y1 has experienced excessive retry operation for the first time is 85 times, for example. That is, m=100 times, u=85 times, and Y=15 times. In this case, the incidence of excessive retrying of the memory cell of the word line address X1 and the bit line address Y1 is 33%. When the incidence of excessive retrying is over the second value, the memory cell provided between the word line number XX and the bit line number YY is categorized as a memory cell inhibited.

A memory cell will, after it has experienced excessive retry operation for the first time, experience excessive retry operation again with a high possibility. Thus, by considering the incidence of excessive retrying of the memory cell from when excessive retry operation has been performed for the first time to the point of time of the present rewriting, a faulty bit can be detected with better accuracy.

Fourth Embodiment

Figure 9:
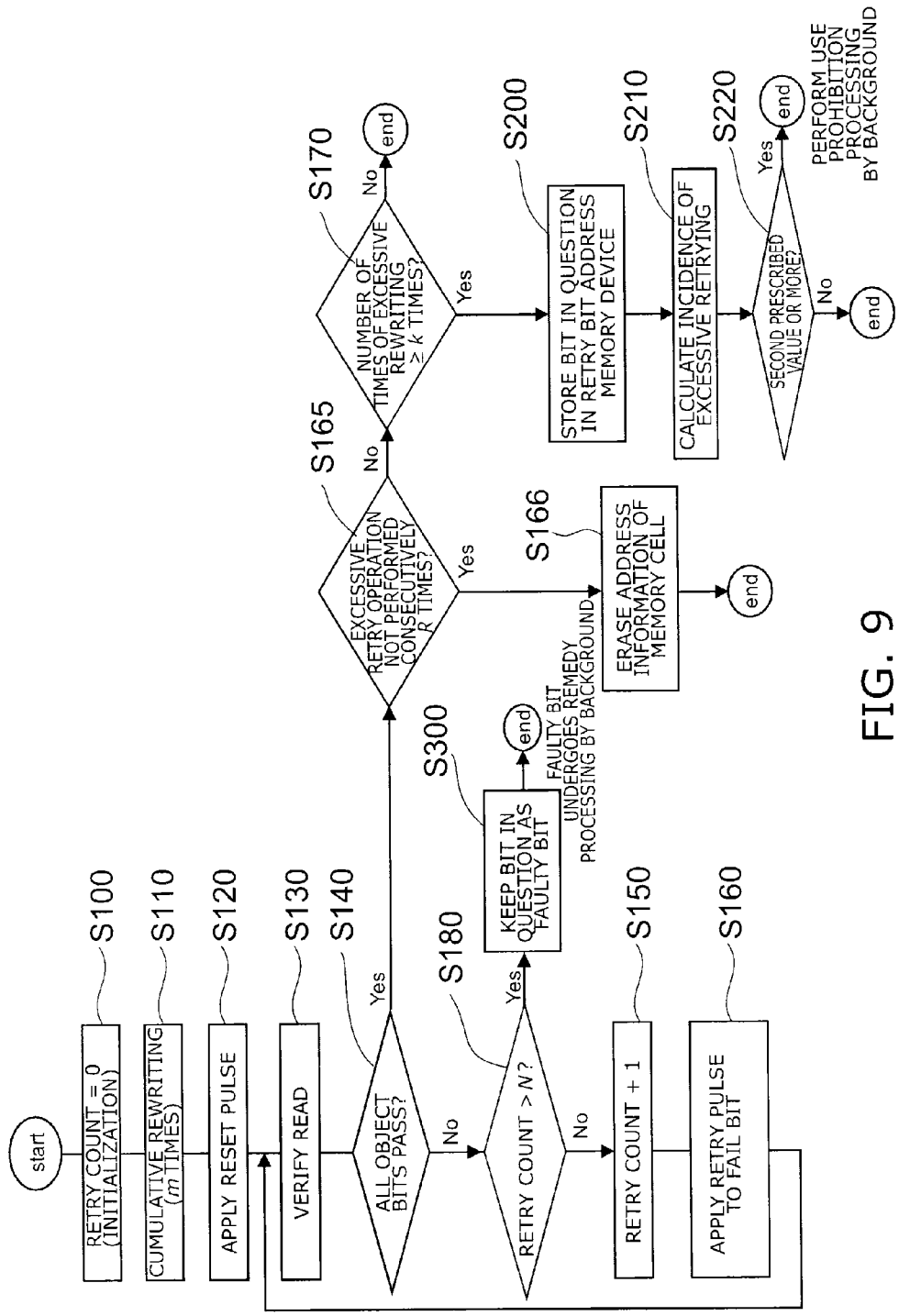
FIG. 9 is an example of a diagram showing a flowchart of a method for driving a resistance change memory according to a fourth embodiment.

FIG. 9 is an example of a diagram showing a flowchart of a method for driving a resistance change memory according to a fourth embodiment.

When a retry operation has not been performed at a fourth value (for example, R times), the control circuit 15 may erase from the retry bit memory device 17 the address information of the memory cell on which excessive retry operation was performed.

For example, when excessive retry operation was performed on a certain memory cell and excessive retry operation has not been performed twice or more since, there is a possibility that the memory cell can further perform the set/reset operation normally. Thus, the control circuit 15 erase from the retry bit memory device 17 the address of a memory cell that has performed the set operation/reset operation normally to a prescribed number of times again even when excessive retry operation was performed (step S165 to step S166 of FIG. 9). Thereby, a memory cell with a small possibility of becoming a faulty bit in the future can be prevented from being categorized as a memory cell inhibited.

In this case, the control circuit can erase also the number of times u of the third embodiment. That is, the control circuit can regard a memory cell that has not experienced excessive retry operation R times as a memory cell that has experienced excessive retry operation yet.

Fifth Embodiment

The second value of the incidence of a retry may be appropriately altered in accordance with the position in the memory cell array 11.

Figure 10A:
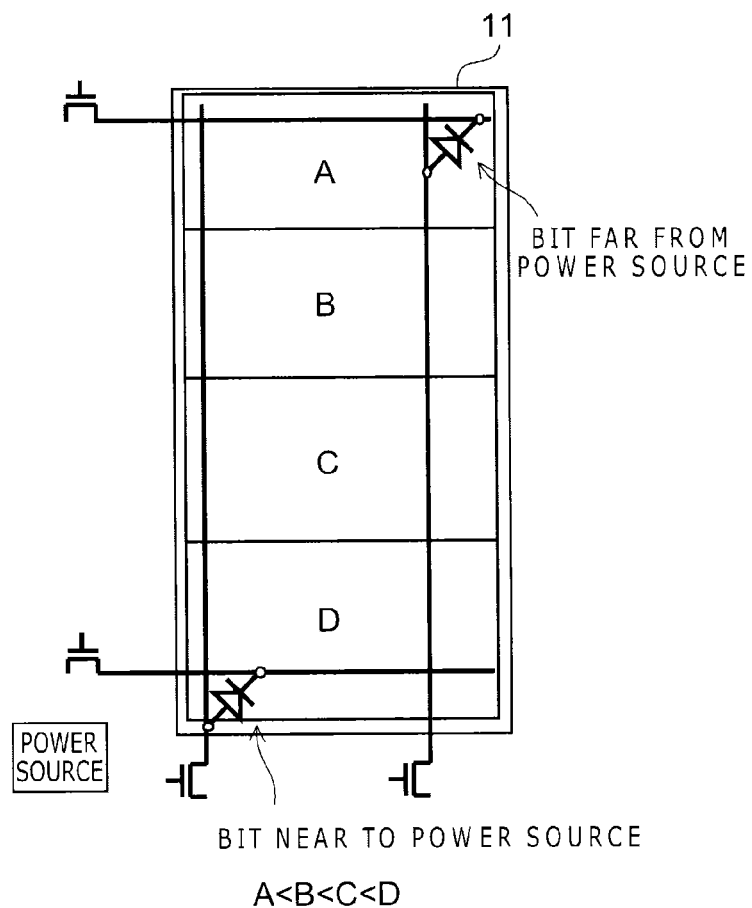
FIG. 10A is an example of a schematic plan view showing positions in the memory cell array and the position of a power source.
Figure 10B:
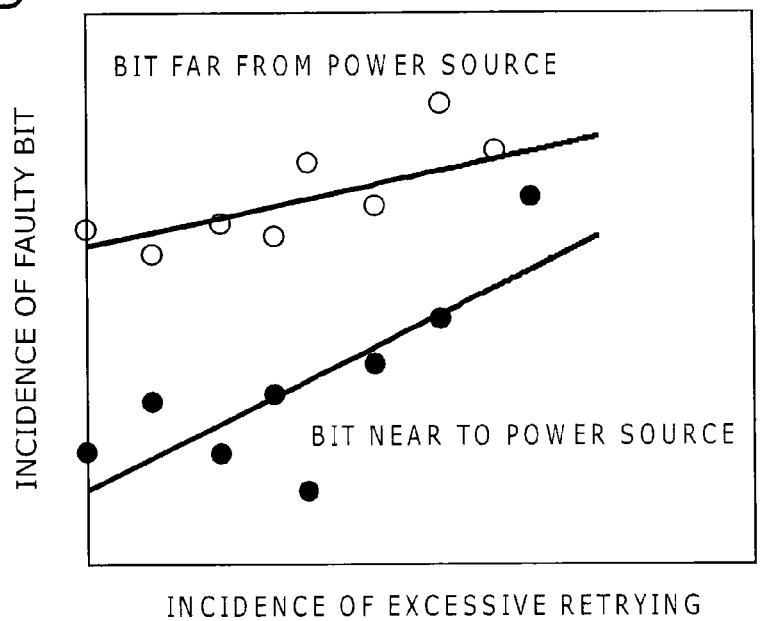
FIG. 10B is a diagram showing a dependence of the incidence of a faulty bit on the position in the memory cell array.

FIG. 10A is an example of a schematic plan view showing positions in the memory cell array and the position of a power source, and FIG. 10B is an example of a diagram showing a dependence of the incidence of a faulty bit on the position in the memory cell array.

The relationship between the incidence of a retry and the incidence of a faulty bit may vary with the position of the memory cell in the memory cell array 11. Here, one ends of the bit lines are connected to the power source via a transistor. One ends of the word lines are connected to the power source via a transistor. The incidence of a faulty bit of a memory cell far from the power source tends to be higher than the incidence of a faulty bit of a memory cell near to the power source, for example. This is presumed to be because the voltage applied to the memory cell becomes lower as the memory cell becomes farther from the power source, due to the influence of a voltage drop of the bit line and the word line.

In view of this, the second value, which is a criterion for determining whether the memory cell is categorized as a memory cell inhibited or not, may be set smaller in a memory cell far from the power source than in a memory cell near to the power source. Thereby, a faulty bit can be detected in an earlier stage.

The second value may be controlled by the region. For example, the memory cell array is divided into four regions, and different second values are set in the regions. Consequently, a faulty bit can be detected in an earlier stage, and circuit operation can be simplified. For example, in FIG. 10A, second prescribed values A, B, C, and D are set in this order from the side far from the power source, and these values have relationships of A<B<C<D. It can be said that, when the second value is exchanged the number of times of excessive retry operation, the memory cell is not inhibited even when the number of times of excessive retry operation increases with distance from the power source.

Sixth Embodiment

Figure 11A:
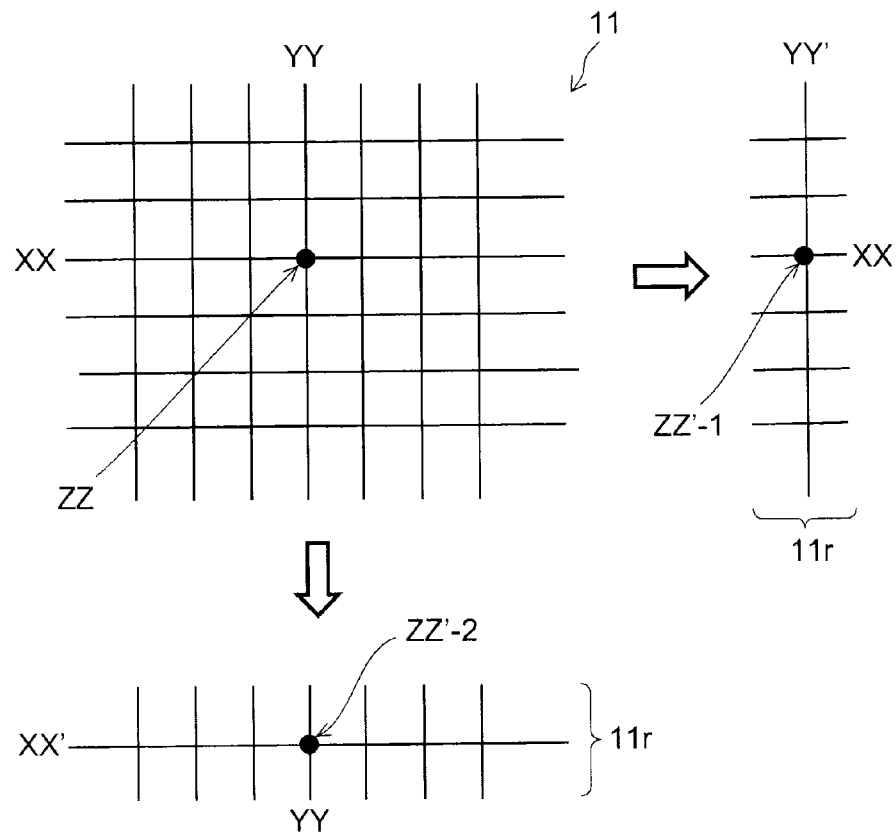
FIG. 11A is an example of a diagram showing the replacement of a bit line or a word line.
Figure 11B:
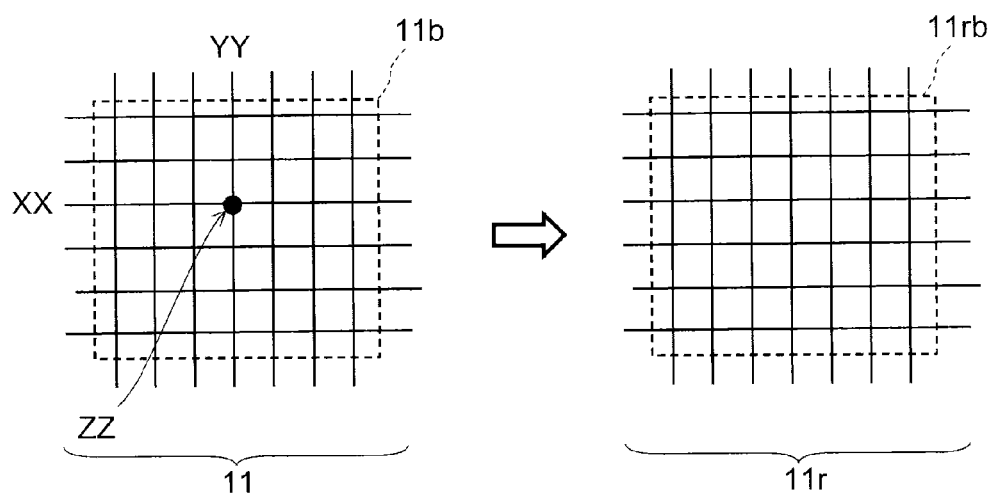
FIG. 11B is a diagram showing the replacement in units of a block.

FIG. 11A is an example of a diagram showing the replacement of a bit line or a word line, and FIG. 11B is an example of a diagram showing the replacement in units of a block.

When the incidence of a retry is over the second value, as shown in FIG. 11A, the bit line connected to the memory cell of that address is replaced with another bit line. For example, a bit line YY connected to a memory cell ZZ prohibited from use for which the number of the word line is XX and the number of the bit line is YY is replaced with a bit line YY' disposed in the redundancy region 11r. A memory cell ZZ'-1 provided between the word line XX and the bit line YY' is a memory cell that operates normally.

Alternatively, when the incidence of excessive retrying is over the second value, as shown in FIG. 11A, the word line connected to the memory cell of that address is replaced with another word line. For example, a word line XX connected to a memory cell ZZ prohibited from use for which the number of the word line is XX and the number of the bit line is YY is replaced with a word line XX' disposed in the redundancy region 11r. A memory cell ZZ'-2 provided between the word line XX' and the bit line YY is a memory cell that operates normally.

Alternatively, when the incidence of excessive retrying is over the second value, as shown in FIG. 11B, a block unit that includes bit lines aligned with the bit line connected to the memory cell of that address and word lines aligned with one of the word lines connected to the memory cell of that address may be replaced with another block unit.

For example, a block unit 11b that includes bit lines aligned with a bit line YY connected to a memory cell ZZ prohibited from use and word lines aligned with a word line XX connected to the memory cell ZZ inhibited may be replaced with a block unit 11rb provided in the redundancy region 11r. In the block unit 11rb, a memory cell that operates normally is provided between each of the plurality of bits and each of the plurality of word lines.

The replacement operation of the bit line or the word line may be performed when a user of the resistance change memory 1 does not access the memory cell array 11.

Seventh Embodiment

In addition to performing the replacement operation described above on a memory cell inhibited, a voltage different from a reset voltage may be applied to the memory cell inhibited to change the resistance of the memory cell inhibited a low resistance value to a high resistance value.

When a user of the resistance change memory 1 does not access the memory cell array 11, a prescribed voltage pulse may be applied to a faulty bit to perform remedy processing for the recovery of a normal operation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

The first to third prescribed values may be stored in a ROM region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
    a memory cell array including first wirings each extending in a first direction, second wirings each extending in a second direction crossing the first direction, and a memory cell connected between the first wirings and the second wirings; and
    a control circuit unit configured to select a selected memory cell from the memory cells, perform a first operation of changing a resistance state of the selected memory cell between a first resistance state and a second resistance state different from the first state, determine whether the first operation has been properly performed or not, and perform retry operation of applying a retry pulse when the first operation has not been properly performed,
    wherein the control circuit unit is configured to inhibit use of the selected memory cell in accordance with the number of times of excessive retry operation, the excessive retry operation is an operation when the number of times of the retry operation for the selected memory cell is over k times (k being an integer of 1 or more).

2. The device according to claim 1, wherein the control circuit unit is configured to inhibit the selected memory cell by the proportion with which the excessive retry operation has occurred in the number of times by which the first operation has been performed.

3. The device according to claim 1, wherein the control circuit unit is configured to inhibit the selected memory cell in accordance with the number of times of the excessive retry operation in the P times of first operations (P being an integer of 1 or more) back to the past from the currently performed first operation.

4. The device according to claim 3, wherein the control circuit unit is configured to inhibit the selected memory cell by the proportion with which the number of times of the excessive retry operation has occurred in the P times.

5. The device according to claim 1, wherein the control circuit unit is configured to control so as to store the number of times of the excessive retry operation.

6. The device according to claim 5, wherein the control circuit unit is configured to erase the number of times of the excessive retry operation when the excessive retry operation has not been performed consecutively R times (R being an integer of 1 or more) in the first operation.

7. The device according to claim 1, wherein the control circuit unit is configured to alter the number of times of the excessive retry operation for inhibiting the selected memory cell in accordance with a position in the memory cell array of the selected memory cell.

8. The device according to claim 1, wherein the control circuit unit, when the selected memory cell is inhibited, is configured to
    replace one of the first wirings connected to the selected memory cell of the address with another first wiring,
    replace one of the second wirings connected to the selected memory cell of the address with another second wiring, or
    replace a block unit including the first wirings aligned with one of the first wirings connected to the selected memory cell of the address and the second wirings aligned with one of the second wirings connected to the selected memory cell of the address with another block unit.

9. The device according to claim 1, wherein the control circuit unit is configured to determine the selected memory cell as a faulty bit when the number of times of the retry operation has reached N times larger than the k times.

10. The device according to claim 1, wherein the control circuit unit is configured to store in a memory region an address of the selected memory cell that have experienced the excessive retry operation and the number of times by which the excessive retry operation has been performed.

11. The device according to claim 10, wherein the control circuit unit is configured to erase the address and the number of times of the excessive retry operation stored in the memory region when the excessive retry operation has not been performed consecutively R times (R being an integer of 1 or more) in the first operation.

12. The device according to claim 7, wherein
one ends of the first wirings are connected to a power source and
the control circuit unit is configured to make a determination of inhibiting the selected memory cell looser for the selected memory cell disposed farther from an end to which a power source is connected in the first wirings.

13. The device according to claim 2, wherein the control circuit unit is configured to alter the proportion with which the excessive retry operation has occurred, which proportion is used to inhibit the selected memory cell, in accordance with a position in the memory cell array of the selected memory cell.

14. The device according to claim 13, wherein
one ends of the first wirings are connected to a power source and
the control circuit unit is configured to set the proportion with which the excessive retry operation has occurred, which proportion is used to inhibit the selected memory cell, smaller for the selected memory cell disposed farther from an end to which a power source is connected in the first wirings.

* * * * *